United States Patent
Ahn et al.

(10) Patent No.: US 10,644,852 B2
(45) Date of Patent: May 5, 2020

(54) METHOD AND DEVICE FOR TRANSMITTING DISCOVERY SIGNAL

(71) Applicant: LG ELECTRONICS INC., Seoul (KR)

(72) Inventors: Joonkui Ahn, Seoul (KR); Kilbom Lee, Seoul (KR); Kijun Kim, Seoul (KR); Hyunsoo Ko, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 16/079,388

(22) PCT Filed: Mar. 23, 2017

(86) PCT No.: PCT/KR2017/003116
§ 371 (c)(1),
(2) Date: Aug. 23, 2018

(87) PCT Pub. No.: WO2017/164663
PCT Pub. Date: Sep. 28, 2017

(65) Prior Publication Data
US 2019/0028253 A1    Jan. 24, 2019

Related U.S. Application Data

(60) Provisional application No. 62/311,919, filed on Mar. 23, 2016.

(51) Int. Cl.
| | | |
|---|---|---|
| H04L 5/00 | (2006.01) | |
| H04B 7/0408 | (2017.01) | |
| H04J 11/00 | (2006.01) | |
| H04L 1/00 | (2006.01) | |
| H04L 1/18 | (2006.01) | |

(Continued)

(52) U.S. Cl.
CPC ......... *H04L 5/0048* (2013.01); *H04B 7/0408* (2013.01); *H04J 11/00* (2013.01); *H04J 11/0069* (2013.01); *H04L 1/0061* (2013.01); *H04L 1/18* (2013.01); *H04W 48/16* (2013.01);
(Continued)

(58) Field of Classification Search
None
See application file for complete search history.

(56) References Cited

U.S. PATENT DOCUMENTS

| | | | | |
|---|---|---|---|---|
| 2015/0016312 A1* | 1/2015 | Li | ............................. | H04L 5/14 370/280 |
| 2015/0085717 A1* | 3/2015 | Papasakellariou | ........ | H04L 5/14 370/280 |

(Continued)

FOREIGN PATENT DOCUMENTS

| | | |
|---|---|---|
| KR | 1020120031475 | 4/2012 |
| KR | 1020130024102 | 3/2013 |

(Continued)

*Primary Examiner* — Ayaz R Sheikh
*Assistant Examiner* — Faiyazkhan Ghafoerkhan
(74) *Attorney, Agent, or Firm* — Dentons US LLP (57) ABSTRACT

A method and a device for transmitting a discovery reference signal (DRS) are provided. The device selects, as a DRS transmission mode, either a switching mode for transmitting a narrow beam or a repeating mode for transmitting a wide beam. The narrow beam covers greater coverage than that of the wide beam. The device transmits the DRS in a plurality of time resources according to the selected DRS transmission mode.

4 Claims, 6 Drawing Sheets a: PSS   b: SSS   c: PBCH (51) Int. Cl.
    *H04W 48/16* (2009.01)
    H03M 13/09 (2006.01)
    H04L 25/02 (2006.01)
(52) U.S. Cl.
    CPC ........... *H03M 13/09* (2013.01); *H04L 5/0007* (2013.01); *H04L 25/0224* (2013.01)

(56) References Cited

U.S. PATENT DOCUMENTS

| | | | |
|---|---|---|---|
| 2016/0100422 A1* | 4/2016 | Papasakellariou | H04L 1/1861 370/329 |
| 2016/0345216 A1* | 11/2016 | Kishiyama | H04W 36/0083 |
| 2016/0353440 A1* | 12/2016 | Lee | H04W 72/0453 |
| 2017/0099092 A1* | 4/2017 | Kakishima | H04B 7/0632 |
| 2018/0014278 A1* | 1/2018 | Papasakellariou | H04W 48/12 |
| 2018/0091196 A1* | 3/2018 | Frenne | H04B 7/0408 |
| 2018/0309496 A1* | 10/2018 | Lee | H04L 5/0044 |
| 2018/0310283 A1* | 10/2018 | Deenoo | H04W 72/042 |
| 2018/0367355 A1* | 12/2018 | Pan | H04L 27/2607 |
| 2018/0375707 A1* | 12/2018 | Bala | H04L 27/2627 |
| 2019/0037569 A1* | 1/2019 | Lee | H04W 72/0453 |
| 2019/0081688 A1* | 3/2019 | Deenoo | H04B 7/0695 |
| 2019/0104549 A1* | 4/2019 | Deng | H04B 7/0617 |
| 2019/0159172 A9* | 5/2019 | Papasakellariou | H04W 72/005 |

FOREIGN PATENT DOCUMENTS

| | | |
|---|---|---|
| KR | 1020140002403 | 1/2014 |
| WO | 2013176529 | 11/2013 |
| WO | 2015065155 | 5/2015 |
| WO | 2015115376 A1 | 8/2015 |
| WO | 2015141070 A1 | 9/2015 |

* cited by examiner

FIG. 3 a: PSS    b: SSS    c: PBCH

FIG. 4

FIG. 5 a: PSS   b: SSS   c: PBCH

FIG. 6

METHOD AND DEVICE FOR TRANSMITTING DISCOVERY SIGNAL

CROSS-REFERENCE TO RELATED APPLICATIONS

This application is the National Stage filing under 35 U.S.C. 371 of International Application No. PCT/KR2017/003116, filed on Mar. 23, 2017, which claims the benefit of U.S. Provisional Application No. 62/311,919 filed on Mar. 23, 2016, the contents of which are all hereby incorporated by reference herein in their entirety.

BACKGROUND OF THE INVENTION

Field of the Invention

The present invention relates to wireless communication, and more particularly, to a method of transmitting a discovery reference signal (DRS) in a wireless communication system, and a device using the method.

Related Art

A next-generation wireless communication system is required to support various user environments and greater communication capacity. Representative issues considered in the next-generation system include massive machine type communications (MTC) for providing various services anytime anywhere by connecting a plurality of devices, ultra-reliable and low-latency communications (URLLC) considering a service sensitive to reliability and latency, or the like.

Transmission using a very short wavelength is considered in a next-generation communication system. In doing so, more antennas can be installed in the same area. For example, a wavelength is 1 cm in a 30 GHz band, and 100 antenna elements can be installed in total in a form of a two-dimensional array with an interval of 0.5λ on a panel of 5 by 5 cm. A beamforming gain may be increased to increase coverage or to significantly improve throughput.

Since a very short wavelength is used, one very narrow beam may be transmitted at one time point. Although coverage capable of serving the wireless device increases, it may be necessary to align a beam direction to the wireless device due to an excessively narrow angle. When a wide beam is transmitted using the same transmit power, coverage to be supported may be reduced.

Provided is a method capable of utilizing a beam having various beam widths.

SUMMARY OF THE INVENTION

The present invention provides a method for transmitting a discovery reference signal (DRS) in a wireless communication system, and a device using the method.

In an aspect, a method for transmitting a discovery reference signal (DRS) in a wireless communication is provided. The method includes selecting, by a base station, one of a switching mode and a repetition mode as a DRS transmission mode, the switching mode being a mode for transmitting a narrow beam, the repetition mode being a mode for transmitting a wide beam, and transmitting, by the base station, the DRS in a plurality of time resources according to the selected DRS transmission mode. The narrow beam covers greater coverage of the base station than the wide beam In another aspect, a device for transmitting a discovery reference signal (DRS) in a wireless communication system includes a transceiver configured to transmit and receive a radio signal and a processor operatively coupled to the transceiver. The processor is configured to select one of a switching mode and a repetition mode as a DRS transmission mode, the switching mode being a mode for transmitting a narrow beam, the repetition mode being a mode for transmitting a wide beam, and control the transceiver to transmit the DRS in a plurality of time resources according to the selected DRS transmission mode. The narrow beam covers greater coverage of the base station than the wide beam.

A service can be adaptively provided in various environments by changing cell coverage.

DESCRIPTION OF EXEMPLARY EMBODIMENTS

A wireless device may be fixed or mobile, and may be referred to as another terminology, such as a user equipment (UE), a mobile station (MS), a mobile terminal (MT), a user terminal (UT), a subscriber station (SS), a personal digital assistant (PDA), a wireless modem, a handheld device, etc. The wireless device may also be a device supporting only data communication such as a machine-type communication (MTC) device.

A base station (BS) is generally a fixed station that communicates with the wireless device, and may be referred to as another terminology, such as an evolved-NodeB (eNB), a base transceiver system (BTS), an access point, etc.

Hereinafter, it is described that the present invention is applied according to a 3rd generation partnership project (3GPP) long term evolution (LTE) based on 3GPP technical specification (TS). However, this is for exemplary purposes only, and thus the present invention is also applicable to various wireless communication networks.

Figure 1:
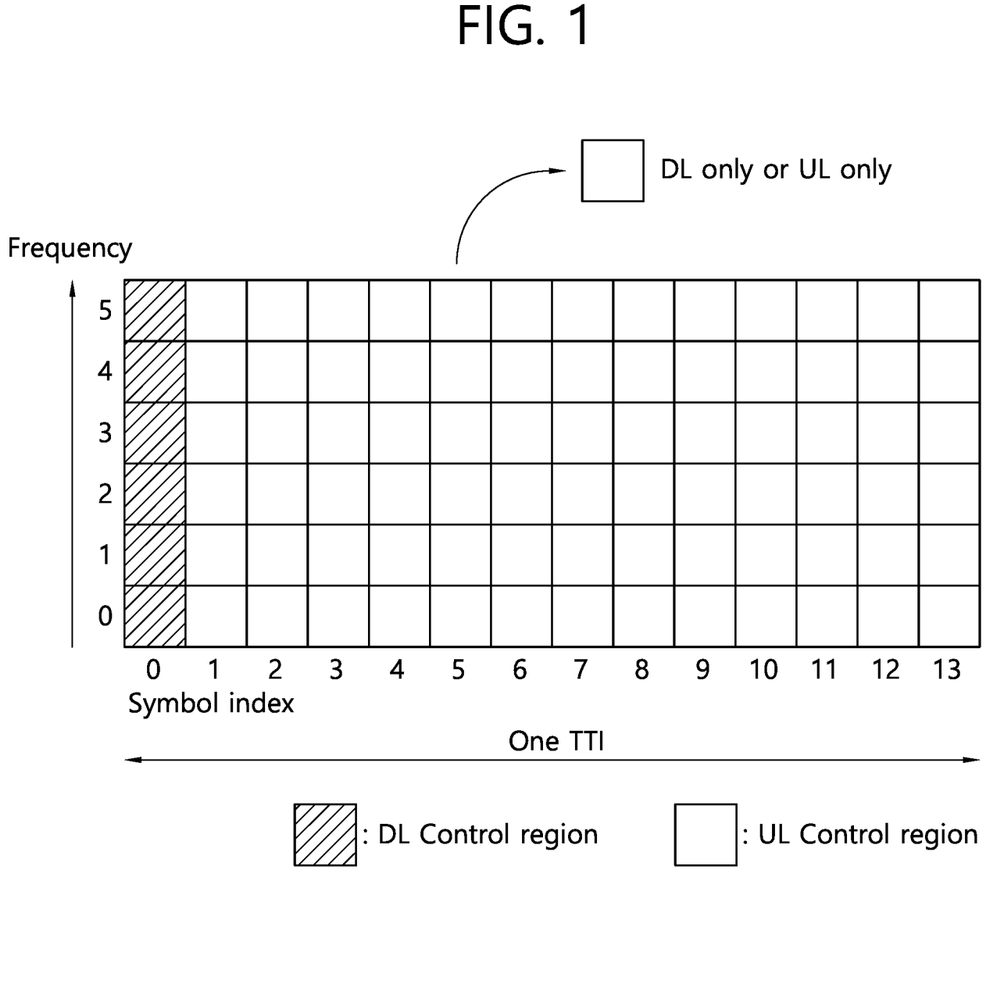
FIG. 1 shows an example of a subframe to which the present invention is applied.

FIG. 1 shows an example of a subframe to which the present invention is applied.

A subframe includes a plurality of orthogonal frequency division multiplexing (OFDM) symbols, and a time of transmitting one subframe is referred to as 1 transmission time interval (TTI). Although one subframe includes 14 OFDM symbols, this is for exemplary purposes only.

A downlink (DL) control channel may be transmitted in first one or more OFDM symbols of the subframe. This is referred to as a DL control region. An uplink (UL) control channel may be transmitted in last one or more OFDM symbols of the subframe. This is referred to as a UL control region. DL scheduling, UL scheduling, or the like may be transmitted through the DL control channel Hybrid automatic repeat request (HARQ) ACK/NACK, channel quality indicator (CQI), or the like may be transmitted through the UL control channel.

DL data or UL data may be transmitted in OFDM symbols located in a middle portion. This is referred to as a DL/UL data region. Some or all of the OFDM symbols may be set to a guard period at a time of switching from DL transmission to UL transmission.

DL transmission and UL transmission may be sequentially performed in one subframe to decrease a time required until data is retransmitted and to minimize latency of data transmission.

A BS may periodically transmit a discovery reference signal (DRS). The DRS may be used for cell discovery, downlink synchronization, downlink measurement, or the like. A downlink (DL) signal based on the existing 3GPP LTE may be used as the DRS. At least any one of a cell specific reference signal (CRS), a primary synchronization signal (PSS), a secondary synchronization signal (SSS), and a channel state information-reference signal (CSI-RS) and/or a combination thereof may be used.

Hereinafter, a DRS includes a PSS, an SSS, and a PBCH. The PSS and SSS refer to a first synchronization signal and second synchronization signal for DL synchronization, and there is no limitation in a structure thereof. The PBCH refers to a channel which transfers broadcast information to be sent to devices in a cell, and there is no limitation in a structure thereof.

Hereinafter, it is exemplified that the PSS, SSS, and PBCH included in the DRS are transmitted in one OFDM symbol. However, the present invention is not limited thereto, and thus the DRS may be transmitted in a subframe or specific time unit.

Hereinafter, coverage refers to a maximum distance in which the DRS transmitted by a BS can arrive at a wireless device with proper reception quality. A narrow beam refers to a beam which supports small directivity and great coverage by supporting a small angle of arrival with respect to a direction of directivity. A wide beam refers to a beam which supports great directivity and small coverage by supporting a great angle of arrival with respect to a direction of directivity.

Figure 2:
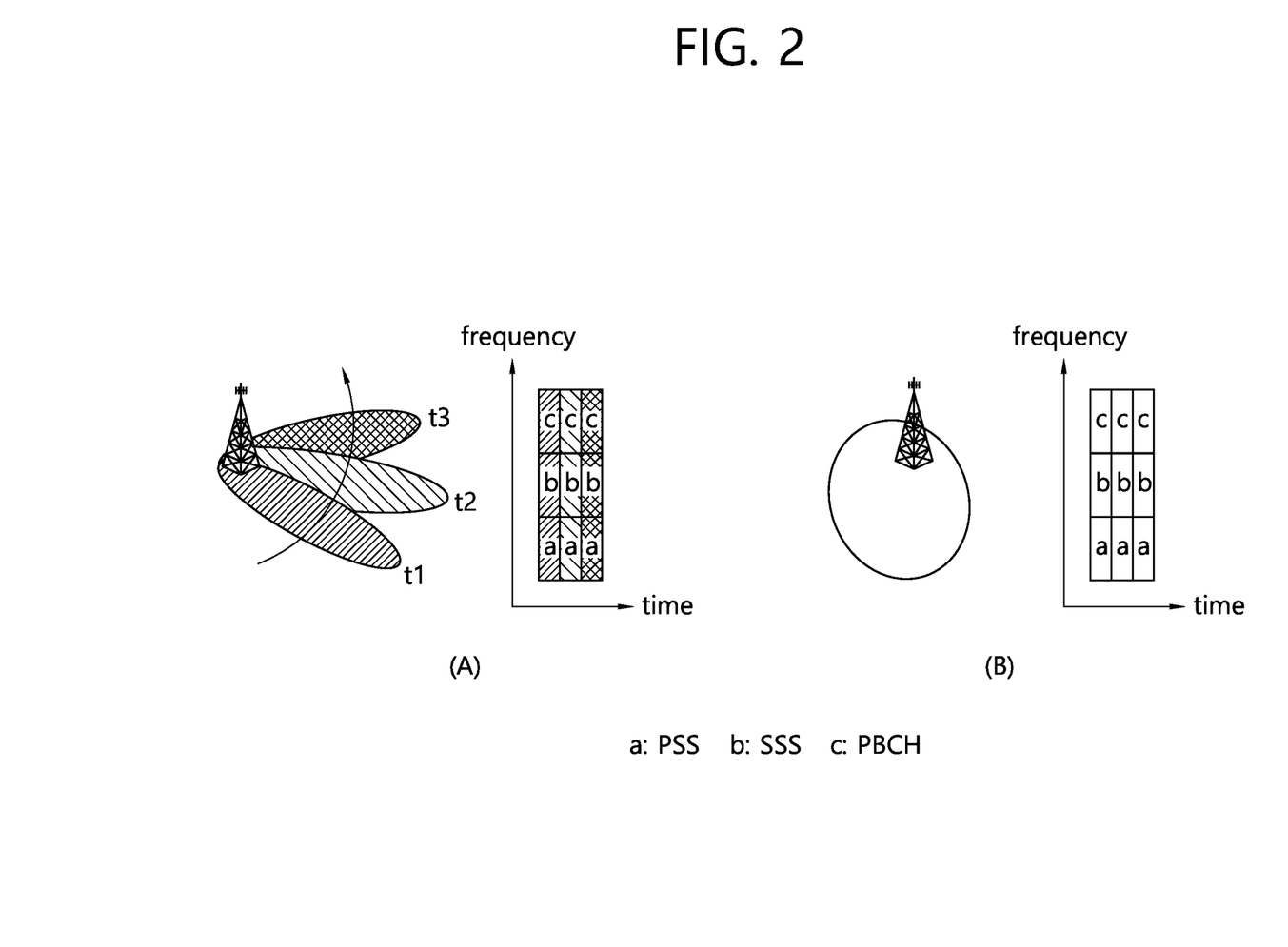
FIG. 2 shows a discovery reference signal (DRS) transmission mode according to an embodiment of the present invention.

FIG. 2 shows a DRS transmission mode according to an embodiment of the present invention.

Subfigure (A) of FIG. 2 shows a switching mode, and transmission is performed by switching a direction of a narrow beam over time. A DRS may be transmitted through each narrow beam.

The narrow beam may be switched in various time units. Switching may be performed in unit of one or more OFDM symbols or one or more subframes. Hereinafter, it is assumed that the narrow beam is switched in an OFDM symbol unit. It may be assumed that a DRS is transmitted through different beams (i.e., beams transmitted with different angles) for each OFDM symbol.

Subfigure (B) of FIG. 2 shows a repetition mode in which a wide beam having relatively great directivity is repeatedly transmitted. A DRS may be transmitted through each wide beam. When the wide beam is repeatedly transmitted in an OFDM symbol unit, the DRS may be repeatedly transmitted through the same beam (i.e., a beam transmitted with the same angle) through a plurality of OFDM symbols.

In a switching mode, the wireless device may attempt to detect the DRS for each OFDM symbol under the assumption that the DRS is independently transmitted in each OFDM symbol. In a repetition mode, the wireless device may attempt detection by combining received DRSs under the assumption that a plurality of DRSs to be received in a plurality of OFDM symbols are transmitted in the same beam. The attempting of the detection through the combination may mean that channel estimation can be performed under the assumption that wireless channel parameters (Doppler spread, delay spread, frequency offset, etc.) have the same or strong correlation. The wireless device may only be able to perform channel estimation and combination estimation under the assumption that wireless channels experienced by the received DRSs have the same or strong correlation, and it may not be necessary to know whether a corresponding DRS is transmitted through the same beam.

The following operation is proposed so that a BS can select and apply one of the switching mode and the repetition mode according to an antenna configuration, a network environment, coverage to be supported, or the like.

The BS may select one of the switching mode and the repetition mode as a DRS transmission mode, and may transmit the DRS at transmission timing determined according to the selected DRS transmission mode. The wireless device may attempt both DRS detection assuming the switching mode and DRS detection assuming the repetition mode at the transmission timing. The wireless device may know the DRS transmission mode on the basis of the DRS detected with higher reliability or higher energy. Alternatively, the wireless device may first attempt PSS/SSS detection assuming the switching mode and PSS/SSS detection assuming the repetition mode at transmitting timing. In addition, the wireless device may attempt PBCH detection according to the detected DRS transmission mode.

In the repetition mode, the BS may transmit the PSS and SSS in the DRS in different OFDM symbols. The number of repetitions required to support the coverage may be decreased by including maximum power that can be allocated to each of the PSS and the SSS. In order to maximize the maximum power that can be allocated to each signal, not only the PSS and the SSS but also the PBCH may be transmitted in different OFDM symbols. The wireless device may find out the DRS transmission mode by using that the PSS, the SSS, and the PBCH are transmitted in one OFDM symbol in the switching mode and the PSS, the SSS, and the PBCH are transmitted in different OFDM symbols in the repetition mode. A position of a frequency at which the SSS is transmitted or a sequence used for the SSS may be applied differently between the two DRS transmission modes, so that the wireless device can detect the DRS transmission mode.

A mode in which the PSS/SSS in the DRS is repeatedly transmitted in one OFDM symbol may be referred to as a first repetition mode, and a mode in which the PSS/SSS in the DRS is transmitted in different OFDM symbols may be a referred to as a second repetition mode. The BS may select one of the switching mode, the first repetition mode, and the second repetition mode as the DRS transmission mode.

Figure 3:
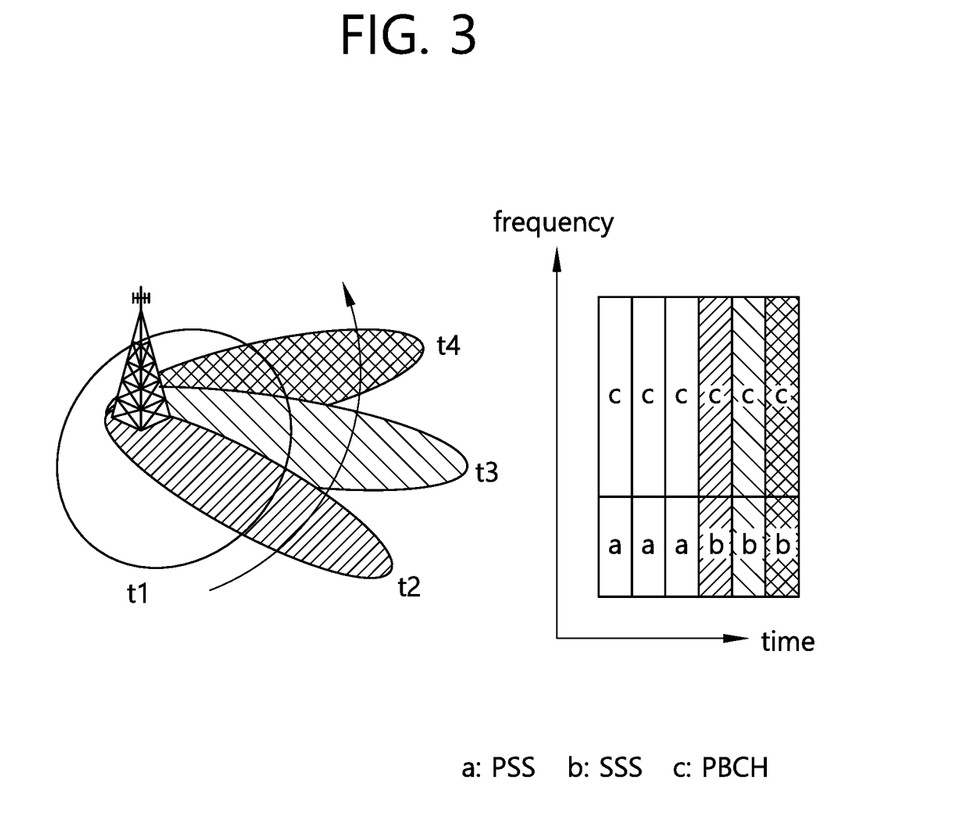
FIG. 3 shows DRS transmission according to an embodiment of the present invention.

FIG. 3 shows DRS transmission according to an embodiment of the present invention.

A BS may transmit a PSS and an SSS through different transmission modes. The BS may transmit the PSS by applying a repetition mode, and may transmit the SSS by selecting one of the switching mode and the repetition mode. It is shown herein that the BS transmits the PSS in first three OFDM symbols by applying the repetition mode, and transmits the SSS in second three OFDM symbols by applying the switching mode. A PBCH may be transmitted according to a transmission mode of the PSS or a transmission mode of the SSS.

The wireless device first attempts to detect the PSS by assuming the repetition mode. In addition, the wireless device may attempt both detection assuming the repetition mode and detection assuming the switching mode in order to receive the SSS. Alternatively, the PSS may include information on the transmission mode of the SSS in order to detect the SSS. The wireless device may detect the PSS, confirm the transmission mode of the SSS on the basis of the detected PSS, and may attempt to detect the SSS. The transmission mode of the SSS may be indicated by a combination of sequences used in the PSS, an order, a frequency arrangement, and a combination of them.

After completion of PSS/SSS detection, the wireless device may attempt PBCH decoding by assuming the same transmission mode as in the PSS in an OFDM symbol in which the PSS is received, and may attempt PBCH decoding by assuming the same transmission mode as in the SSS in an OFDM symbol in which the SSS is received. Decoding may be attempted by combining PBCHs received in an OFDM symbol in which the PSS is received and PBCHs received in an OFDM symbol in which the SSS is received.

Figure 4:
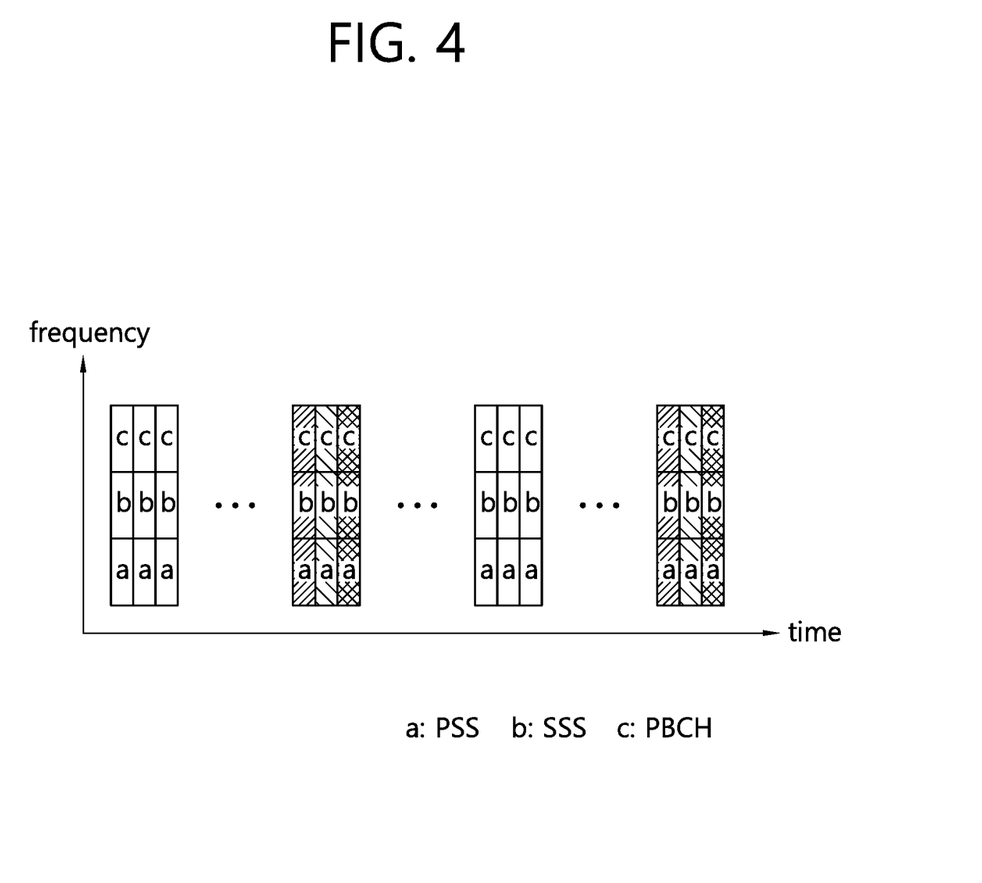
FIG. 4 shows DRS transmission according to another embodiment of the present invention.

FIG. 4 shows DRS transmission according to another embodiment of the present invention.

A BS may transmit a DRS according to a repetition mode at first timing, and may transmit the DRS according to a switching mode at second timing. The BS may transmit the DRS by selecting one of the repetition mode and the switching mode at a specific period.

A wireless device may attempt DRS detection by assuming only one transmission mode when initial connection is achieved, and may attempt DRS detection for the two transmission modes after a connection with the BS is successful. When the initial connection is achieved, the wireless device attempts only DRS detection assuming the repetition mode. After the connection with the BS is successful, the wireless device may acquire information on a DRS transmission structure and transmission timing, and may attempt DRS detection for the two transmission modes in a state of being connected with the BS.

This method may be advantageous for maintaining measurement and synchronization with respect to the connected BS even if proper beam directivity varies depending on a movement of the wireless device. The wireless device may perform radio resource management (RRM) on the DRS transmitted in the repetition mode, and may report the measurement result to the BS. According to the measurement result, the wireless device may determine a DL synchronization level and thus may determine whether to maintain the connection to the BS or to switch the connection to a neighboring BS. The wireless device may report to the BS not only a measurement result for the DRS transmitted in the switching mode but also the DRS transmitted in the switching mode.

The BS may inform mode information on the DRS transmission mode through the PBCH. The mode information may include at least one of information indicating the switching mode or the repetition mode, a period in which the transmission mode is changed, and the number of repetitions. A payload transmitted on the PBCH may include the mode information. Alternatively, the mode information may be masked to cyclic redundancy check (CRC) of the payload transmitted on the PBCH. A radio resource to which the payload transmitted on the PBCH is mapped may be placed differently according to the mode information.

Figure 5:
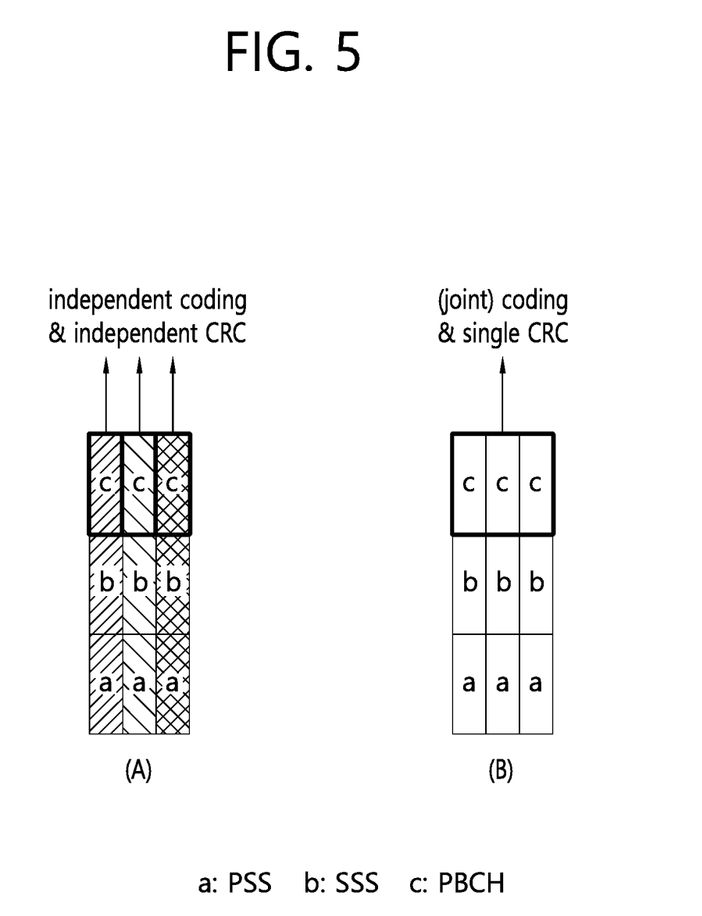
FIG. 5 shows an example of indicating mode information by using a physical broadcast channel (PBCH).

FIG. 5 shows an example of indicating mode information by using a PBCH.

Time-frequency resource mapping of a payload of a PBCH may be differentiated according to a DRS transmission mode. For example, in a switching mode, the payload of the PBCH is encoded independently for each OFDM symbol. This means that the payload of the PBCH transmitted in each OFDM symbol has corresponding CRC. In a repetition mode, the payload of the PBCH is jointly encoded across repeated OFDM symbols. This means that the payload of the PBCH transmitted in the repeated OFDM symbols has only one CRC.

The DRS transmission mode may be selected for each frequency band in which a network operates. The wireless device may assume a predetermined DRS transmission mode according to a frequency band in which the wireless device attempts to detect the DRS. For example, the switching mode may be applied to a high frequency band (e.g., >6 GHz) in which a narrow beam configuration using a relatively large number of antenna ports is easy, and the repetition mode may be applied to a frequency band lower than that. In a specific frequency band in which a plurality of DRS transmission modes are applicable, the wireless device may attempt to detect the DRS on the basis of the plurality of DRS transmission modes. The DRS transmission mode which is applied by the wireless device in each frequency band may be stored in a memory.

Figure 6:
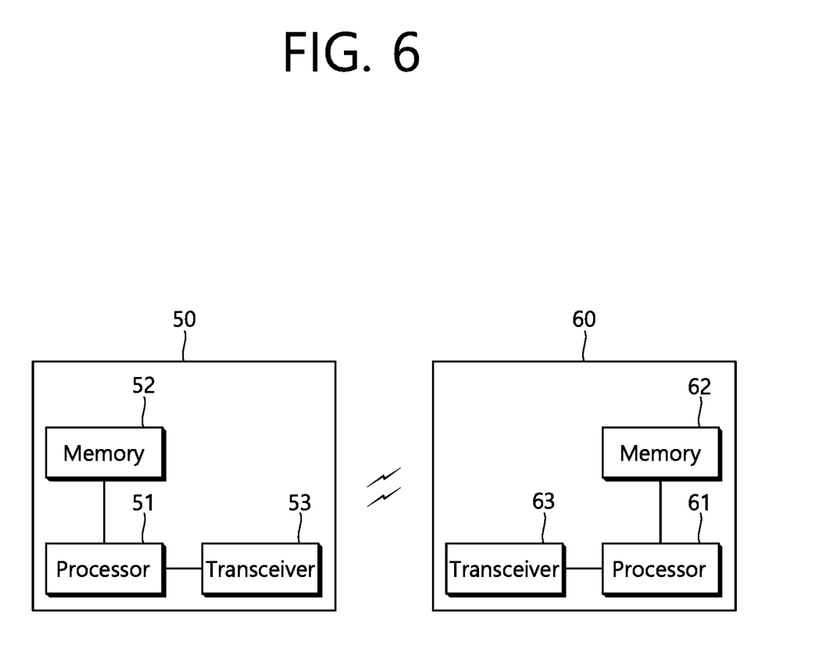
FIG. 6 is a block diagram showing a wireless communication system according to an embodiment of the present invention.

FIG. 6 is a block diagram showing a wireless communication system according to an embodiment of the present invention.

A wireless device 50 includes a processor 51, a memory 52, and a transceiver 53. The memory 52 is coupled to the processor 51, and stores various instructions executed by the processor 51. The transceiver 53 is coupled to the processor 51, and transmits and/or receives a radio signal. The processor 51 implements the proposed functions, procedures, and/or methods. In the aforementioned embodiment, an operation of the wireless device may be implemented by the processor 51. When the aforementioned embodiment is implemented with a software instruction, the instruction may be stored in the memory 52, and may be executed by the processor 51 to perform the aforementioned operation.

A BS 60 includes a processor 61, a memory 62, and a transceiver 63. The BS 60 may operate in an unlicensed band. The memory 62 is coupled to the processor 61, and stores various instructions executed by the processor 61. The transceiver 63 is coupled to the processor 61, and transmits and/or receives a radio signal. The processor 61 implements the proposed functions, procedures, and/or methods. In the aforementioned embodiment, an operation of the BS may be implemented by the processor 61.

The processor may include Application-Specific Integrated Circuits (ASICs), other chipsets, logic circuits, and/or data processors. The memory may include Read-Only Memory (ROM), Random Access Memory (RAM), flash memory, memory cards, storage media and/or other storage devices. The transceiver may include a baseband circuit for processing a radio signal. When the above-described embodiment is implemented in software, the above-described scheme may be implemented using a module (process or function) which performs the above function. The module may be stored in the memory and executed by the processor. The memory may be disposed to the processor internally or externally and connected to the processor using a variety of well-known means.

In the above exemplary systems, although the methods have been described on the basis of the flowcharts using a series of the steps or blocks, the present invention is not limited to the sequence of the steps, and some of the steps may be performed at different sequences from the remaining steps or may be performed simultaneously with the remaining steps. Furthermore, those skilled in the art will understand that the steps shown in the flowcharts are not exclusive and may include other steps or one or more steps of the flowcharts may be deleted without affecting the scope of the present invention.

What is claimed is:

1. A method for receiving a discovery reference signal (DRS) in a wireless communication system, the method performed by a wireless device comprising:

receiving a broadcast channel over a plurality of orthogonal frequency division multiplexing (OFDM) symbols from a base station;

selecting one of a switching mode and a repetition mode as a DRS transmission mode based on the broadcast channel, the switching mode being a mode in which the wireless device attempts to detect the DRS assuming that the base station transmits the DRS through a narrow beam, the repetition mode being a mode in which the wireless device attempts to detect the DRS assuming that the base station transmits the DRS through a wide beam, wherein the narrow beam covers greater coverage than the wide beam; and detecting the DRS from the base station based on the selected DRS transmission mode, wherein the switching mode is selected as the DRS transmission mode when a cyclic redundancy check (CRC) of the broadcast channel is detected in each of the plurality of OFDM symbols, and wherein the repetition mode is selected as the DRS transmission mode when a single CRC of the broadcast channel is detected across all of the plurality of OFDM symbols.

2. The method of claim 1, wherein the DRS comprises a synchronization signal for downlink synchronization.

3. A device for receiving a discovery reference signal (DRS) in a wireless communication system, the device comprising:

a transceiver configured to transmit and receive a radio signal; and a processor operatively coupled to the transceiver and configured to:

control the transceiver to receive a broadcast channel over a plurality of orthogonal frequency division multiplexing (OFDM) symbols from a base station;

select one of a switching mode and a repetition mode as a DRS transmission mode based on the broadcast channel, the switching mode being a mode in which the device attempts to detect the DRS assuming that the base station transmits the DRS through a narrow beam, the repetition mode being a mode in which the device attempts to detect the DRS assuming that the base station transmits the DRS through a wide beam, wherein the narrow beam covers greater coverage than the wide beam; and control the transceiver to detect the DRS from the base station based on the selected DRS transmission mode, wherein the switching mode is selected as the DRS transmission mode when a cyclic redundancy check (CRC) of the broadcast channel is detected in each of the plurality of OFDM symbols, and wherein the repetition mode is selected as the DRS transmission mode when a single CRC of the broadcast channel is detected across all of the plurality of OFDM symbols.

4. The device of claim 3, wherein the DRS comprises a synchronization signal for downlink synchronization.

* * * * *